US007429406B2

(12) United States Patent
Park et al.

(10) Patent No.: US 7,429,406 B2
(45) **Date of Patent: *Sep. 30, 2008**

(54) METHOD OF FORMING THIN RUTHENIUM-CONTAINING LAYER

(75) Inventors: Soon-Yeon Park, Daegu-shi (KR); Cha-Young Yoo, Kyunggi-do (KR); Seok-Jun Won, Seoul (KR)

(73) Assignee: Samsung Electronics Co., Inc. (KR)

( * ) Notice: Subject to any disclaimer, the term of this patent is extended or adjusted under 35 U.S.C. 154(b) by 771 days.

This patent is subject to a terminal disclaimer.

(21) Appl. No.: 11/014,214

(22) Filed: Dec. 16, 2004

(65) Prior Publication Data

US 2005/0118335 A1 Jun. 2, 2005

Related U.S. Application Data

(60) Continuation of application No. 10/288,742, filed on Nov. 6, 2002, now abandoned, and a continuation-in-part of application No. 10/800,826, filed on Mar. 15, 2004, now Pat. No. 7,271,038, which is a division of application No. 09/742,647, filed on Dec. 21, 2000, now Pat. No. 6,750,092.

(30) Foreign Application Priority Data

| | | |
|---|---|---|
| Dec. 23, 1999 | (KR) | 1999-61337 |
| Mar. 10, 2000 | (KR) | 2000-12056 |
| Dec. 28, 2001 | (KR) | 2001-87088 |

(51) Int. Cl.
*B05D 1/36* (2006.01)
*C23C 16/00* (2006.01)

(52) U.S. Cl. ............... 427/404; 427/248.1; 427/255.31; 427/402

(58) Field of Classification Search ............ 427/255.31, 427/252, 248.1
See application file for complete search history.

(56) References Cited

U.S. PATENT DOCUMENTS

| | | | | |
|---|---|---|---|---|
| 5,231,056 | A | 7/1993 | Sandhu | 437/200 |
| 5,314,845 | A | 5/1994 | Lee et al. | 437/238 |
| 5,372,849 | A | 12/1994 | McCormick et al. | 427/253 |
| 5,834,357 | A | 11/1998 | Kang | 438/396 |
| 6,063,705 | A | 5/2000 | Vaartstra | 438/681 |
| 6,420,582 | B1 * | 7/2002 | Okamoto | 556/136 |
| 6,440,495 | B1 | 8/2002 | Wade et al. | 427/250 |
| 6,479,100 | B2 | 11/2002 | Jin et al. | 427/255.31 |
| 6,680,251 | B2 * | 1/2004 | Won et al. | 438/680 |
| 6,750,092 | B2 * | 6/2004 | Won et al. | 438/239 |
| 2001/0006838 | A1 * | 7/2001 | Won et al. | 438/396 |
| 2001/0031527 | A1 | 10/2001 | Park | 438/239 |
| 2001/0054730 | A1 | 12/2001 | Kim et al. | 257/301 |
| 2002/0055254 | A1 | 5/2002 | Sano et al. | 438/674 |
| 2002/0058415 | A1 | 5/2002 | Derderian et al. | 438/686 |
| 2002/0146513 | A1 | 10/2002 | Jin et al. | 427/255.28 |
| 2002/0192896 | A1 * | 12/2002 | Matsui et al. | 438/239 |

FOREIGN PATENT DOCUMENTS

| | | |
|---|---|---|
| JP | 2000-281694 | 10/2000 |
| JP | 2001-230389 | 8/2001 |
| JP | 2001-234347 | 8/2001 |
| JP | 2002-114795 | 4/2002 |
| WO | WO00/22658 | 4/2000 |

* cited by examiner

*Primary Examiner*—Timothy Meeks
*Assistant Examiner*—David Turocy
(74) *Attorney, Agent, or Firm*—Myers Bigel Sibley & Sajovec

(57) ABSTRACT

A method of forming a thin ruthenium-containing layer includes performing a CVD process using butyl ruthenoscene as a ruthenium source material. The thin ruthenium-containing layer may be formed by a one-step or two-step CVD process. The one-step CVD process is performed under a constant oxygen flow rate and a constant deposition pressure. The two-step CVD process includes forming a seed layer and forming a main layer, each of which is performed under a different process condition of a deposition temperature, an oxygen flow rate, and a deposition pressure.

18 Claims, 14 Drawing Sheets

Pressure = 0.5Torr
Thickness (Å)
300
200
100
0
O2(sccm)/Ru(ccm)
0
10000
20000
30000
40000
50000
60000
(a)
(b)
(c)
(d)

METHOD OF FORMING THIN RUTHENIUM-CONTAINING LAYER

RELATED APPLICATIONS

This application is a continuation of U.S. application Ser. No. 10/288,742, filed Nov. 6, 2002, now abandoned, the disclosure of which is hereby incorporated herein by reference. This application is also a continuation-in-part of U.S. application Ser. No. 10/800,826, filed Mar. 15, 2004, now U.S. Pat. No. 7,271,038, which is a divisional of U.S. application Ser. No. 09/742,647, filed Dec. 21, 2000, now U.S. Pat. No. 6,750,092.

FIELD OF THE INVENTION

The present invention relates to methods for fabricating semiconductor devices and, more particularly, to a method of forming a thin ruthenium-containing layer that may be used as a conductive layer of a semiconductor device.

BACKGROUND OF THE INVENTION

Ruthenium is a noble metal (like platinum or iridium) and has been extensively studied for use as a conductive layer of a highly integrated memory device. In particular, a ruthenium conductive layer may be used in the formation of an electrode of an MIM-type capacitor. In a highly integrated memory device such as a DRAM or FRAM, it is important that each of the capacitors has a large capacitance while occupying a small area. In order to increase the capacitance, a method for increasing a surface area of a capacitor electrode or a method for reducing a thickness of a dielectric layer may be employed. In addition, materials with high dielectric constants may be used so as to increase the capacitance. As examples of materials having high dielectric constants, there are metal oxides such as TaO and TaON, and perovskite materials such as BST, PZT, and the like. The metal oxides such as TaO and TaON have dielectric constants amounting to several times to several hundred times as high as that of a silicon oxide layer.

However, when a capacitor electrode layer and the capacitor dielectric layer are made of polysilicon and a material having a high dielectric constant as discussed above, respectively, a surface of the polysilicon may be oxidized during the process of forming the layers. In addition, in order to obtain a stable leakage current characteristic, a low k-dielectric layer such as a silicon nitride oxide layer must be formed to prevent reaction between the polysilicon and a high k-dielectric layer. However, because the silicon nitride oxide layer has a low dielectric constant, the thickness of the dielectric layer is substantially increased and the capacitance is substantially reduced. On the other hand, when the electrode of the MIM capacitor comprises a metal having a work function that is larger than that of the dielectric layer, a leakage current barrier may be formed due to a difference in the work function between the dielectric layer and the electrode. Therefore, it is unnecessary to additionally form a leakage current barrier layer that may induce a decrease in the capacitance.

The electrode of the MIM capacitor is normally composed of a material selected from the group consisting of noble metals such as platinum, ruthenium, and iridium and their metal oxides. The noble metals and their metal oxides have large work functions and do not react on the dielectric layer. In particular, unlike other noble metals, ruthenium may be readily etched by a plasma etching process using oxygen. In addition, even if oxidized, the resulting ruthenium oxide still has conductivity. In this respect, ruthenium has been recognized as a material more suitable for forming the capacitor electrode than other materials.

In the fabrication of a semiconductor device, a material like bis(cyclopentadienyl)ruthenium [$Ru(EtCp)_2$] or ruthenium acetylacetonate [$Ru(OD)_3$] is known as a source material of the chemical vapor deposition (CVD) process needed for forming a ruthenium layer. The source materials may be represented by structural formulas as shown in FIG. 1. Unfortunately, the ruthenium source materials may be easily oxidized under typical circumstances. In addition, because the cost of ruthenium itself is high and the fabrication of a ligand of the source material is difficult, the cost of the source material is typically high.

Furthermore, if the ruthenium layer is formed using a conventional source material like $Ru(EtCp)_2$, it is difficult to form a thin layer for the capacitor electrode using a one-step process. In other words, as both the deposition pressure and an oxygen flow rate increase, the number of ruthenium nuclei per unit area increases. Thus, the ruthenium layer forms a columnar structure. The ruthenium layer with the columnar structure has a rough surface and suffers a high sheet resistance as well as a high leakage current. By contrast, as both the deposition pressure and the oxygen flow rate decrease, the number of the ruthenium nuclei per unit area is reduced, although the nuclei are isotropically formed. Hence, the electrical resistance of the ruthenium layer is increased.

Therefore, in order to form the ruthenium layer using a conventional ruthenium source material like $Ru(EtCp)_2$, the CVD process should include at least two steps. However, if a two-step process is performed in-situ, the process conditions may become unstable between the first and second steps. This may result in degradation of reproducibility or reliability of the process. In addition, a cooling gas injected into a chamber during the process may change the process pressure, thus permitting the position of a wafer to be varied. As a result, characteristics of the ruthenium layer may be varied. Meanwhile, if the second step is performed in another apparatus, the wafer should be shifted from a first apparatus into a second apparatus and the process conditions must be newly adjusted in the second apparatus. As a result, process efficiency may be lowered.

It is well known to those skilled in the art that if $Ru(OD)_3$ is used as the source material, a one-step process may be performed. At this time, however, because the ratios of carbon and oxygen contained in $Ru(OD)_3$ are high, there may arise problems caused by impurities like carbon. That is, the ruthenium layer may suffer deterioration of both an electrical characteristic and a step coverage characteristic.

SUMMARY OF THE INVENTION

According to method embodiments of the present invention, a method of forming a thin ruthenium-containing layer includes performing a chemical vapor deposition (CVD) process using butyl ruthenoscene [$C_5H_5Ru(C_5H_4CH_2CH_2CH_2CH_3)$] as a source material and using an oxygen-containing gas as a reaction material to separate elemental ruthenium element from the butyl ruthenoscene.

According to further method embodiments of the present invention, a method of forming a thin ruthenium-containing layer includes providing a supply of butyl ruthenoscene [$C_5H_5Ru(C_5H_4CH_2CH_2CH_2CH_3)$] and providing a supply of an oxygen-containing gas selected from the group consisting of oxygen, ozone, and oxygen plasma. A ruthenium element is deposited from the butyl ruthenoscene onto the substrate using a chemical vapor deposition (CVD) process wherein the oxygen-containing gas reacts with the butyl ruthenoscene to separate the ruthenium element from the butyl ruthenoscene. The thin ruthenium-containing layer comprises at least one of a ruthenium layer and a ruthenium oxide layer.

Embodiments of the present invention may be used to form a ruthenium layer using a new ruthenium source gas under more favorable conditions as compared with conventional methods. For example, the methods of the present invention may be used to form a ruthenium layer for an electrode by a one-step or two-step CVD process without causing a leakage current or increasing sheet resistance.

Objects of the present invention will be appreciated by those of ordinary skill in the art from a reading of the figures and the detailed description of the preferred embodiments which follow, such description being merely illustrative of the present invention.

BRIEF DESCRIPTION OF THE DRAWINGS

FIGS. 4A through 8B are electron micrographs showing both a surface morphology and a step coverage of a ruthenium layer formed by a two-step CVD process using butyl ruthenoscene in accordance with embodiments of the present invention.

DETAILED DESCRIPTION OF THE PREFERRED EMBODIMENTS

Figure 1:
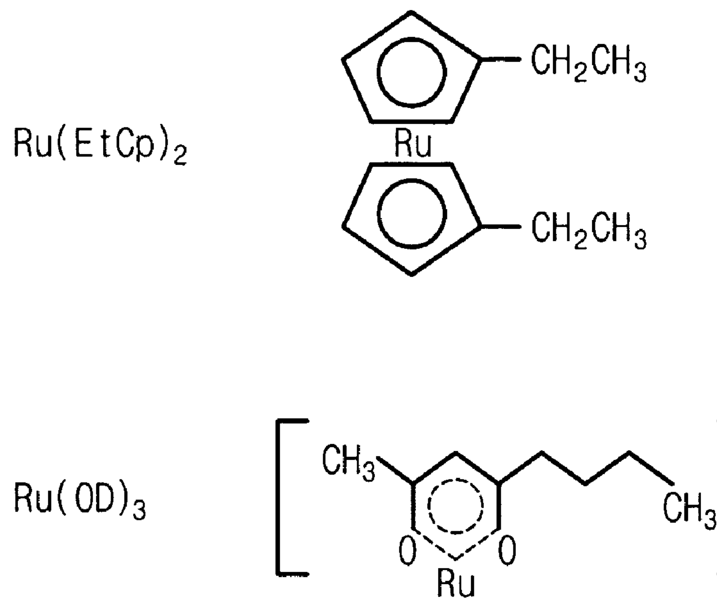
FIG. 1 illustrates chemical structures of conventional ruthenium source materials.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

As used herein, "ruthenium layer" refers to a ruthenium-containing layer.

According to method embodiments of the present invention, a method of forming a thin ruthenium-containing layer includes performing a CVD process using butyl ruthenoscene [$C_5H_5Ru(C_5H_4CH_2CH_2CH_2CH_3)$] as a ruthenium source material. The thin ruthenium-containing layer may be formed by a one-step or two-step CVD process. The one-step CVD process may be performed under a constant oxygen flow rate and a constant deposition pressure. The two-step CVD process may include forming a seed layer and forming a main layer, each of which is performed under a different process condition of a deposition temperature, an oxygen flow rate, and a deposition pressure.

The ruthenium layer is generally formed as a conductive layer composed of ruthenium, ruthenium oxide, or a combination thereof. Butyl ruthenoscene is a liquid compound under normal conditions of temperature and pressure and may be vaporized by heating and injected into a process chamber.

The ruthenium layer may be stacked using a one-step CVD process under the same process conditions of an oxygen flow rate and a deposition pressure. The one-step CVD process may be performed at a deposition pressure of 0.5 to 30 Torr, with oxygen and liquid butyl ruthenoscene being supplied at a flow rate of 300-2000 sccm and 0.02-0.05 ccm, respectively.

Alternatively, the ruthenium layer may be stacked by a two-step CVD process. The two-step CVD process includes forming a seed layer and forming a main layer under different process conditions. In the two-step CVD process, the seed layer is formed at a deposition pressure of 0.5 to 30 Torr, with oxygen and butyl ruthenoscene being supplied at a flow rate of 500-2000 sccm and 0.02-0.05 ccm, respectively. In addition, the main layer is formed at a deposition pressure of 0.5 to 10 Torr, with oxygen and butyl ruthenoscene being supplied at a flow rate of 40-1000 sccm and 0.02-0.05 ccm, respectively.

Preferably, the ruthenium layer is stacked with the surface temperature of the wafer at 250 to 400° C. The surface temperature is selected in consideration of the characteristics of butyl ruthenoscene, i.e., a decomposition characteristic and a reaction characteristic with other materials like oxygen. Meanwhile, when the ruthenium layer is formed by the two-step CVD process at the foregoing temperature condition, the seed and main layers are preferably formed at different deposition temperatures. The seed layer may be formed at higher or lower temperatures as compared with the main layer. For example, if the seed layer is formed at a temperature of 300° C., the main layer may be formed at a temperature of 320° C. By contrast, if the seed layer is formed at a temperature of 320° C., the main layer may be formed at a temperature of 300° C.

The ruthenium layer may be stacked using an inactive gas including nitrogen or argon along with oxygen for a reaction gas. In this case, oxygen may be supplied in a molecular state, or as ozone or oxygen plasma in order to increase activity. To form the oxygen plasma, the oxygen of a plasma phase may be directly injected into the CVD chamber. Alternatively, after injecting an oxygen gas into a CVD chamber, a high-frequency electrical field may be applied to the chamber.

The method of forming the ruthenium layer may further include forming the seed layer by sputtering before the CVD process.

Figure 2:
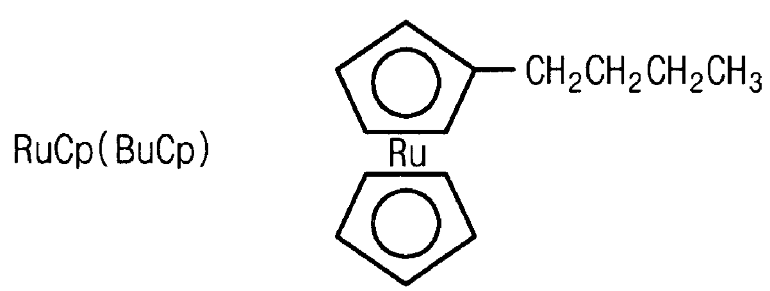
FIG. 2 illustrates a chemical structure of butyl ruthenoscene [$C_5H_5Ru(C_5H_4CH_2CH_2CH_2CH_3)$] in accordance with embodiments of the present invention.

FIG. 2 illustrates the chemical structure of butyl ruthenoscene [$C_5H_5Ru(C_5H_4CH_2CH_2CH_2CH_3)$]. In the case of bis (cyclopentadienyl)ruthenium [$Ru(EtCp)_2$] as shown in FIG. 1, an ethyl group is attached to each of two rings, each of which has five carbon atoms. As compared with $Ru(EtCp)_2$, in butyl ruthenoscene, a butyl group is attached to one of two rings, each of which has five carbon atoms.

Figure 3:
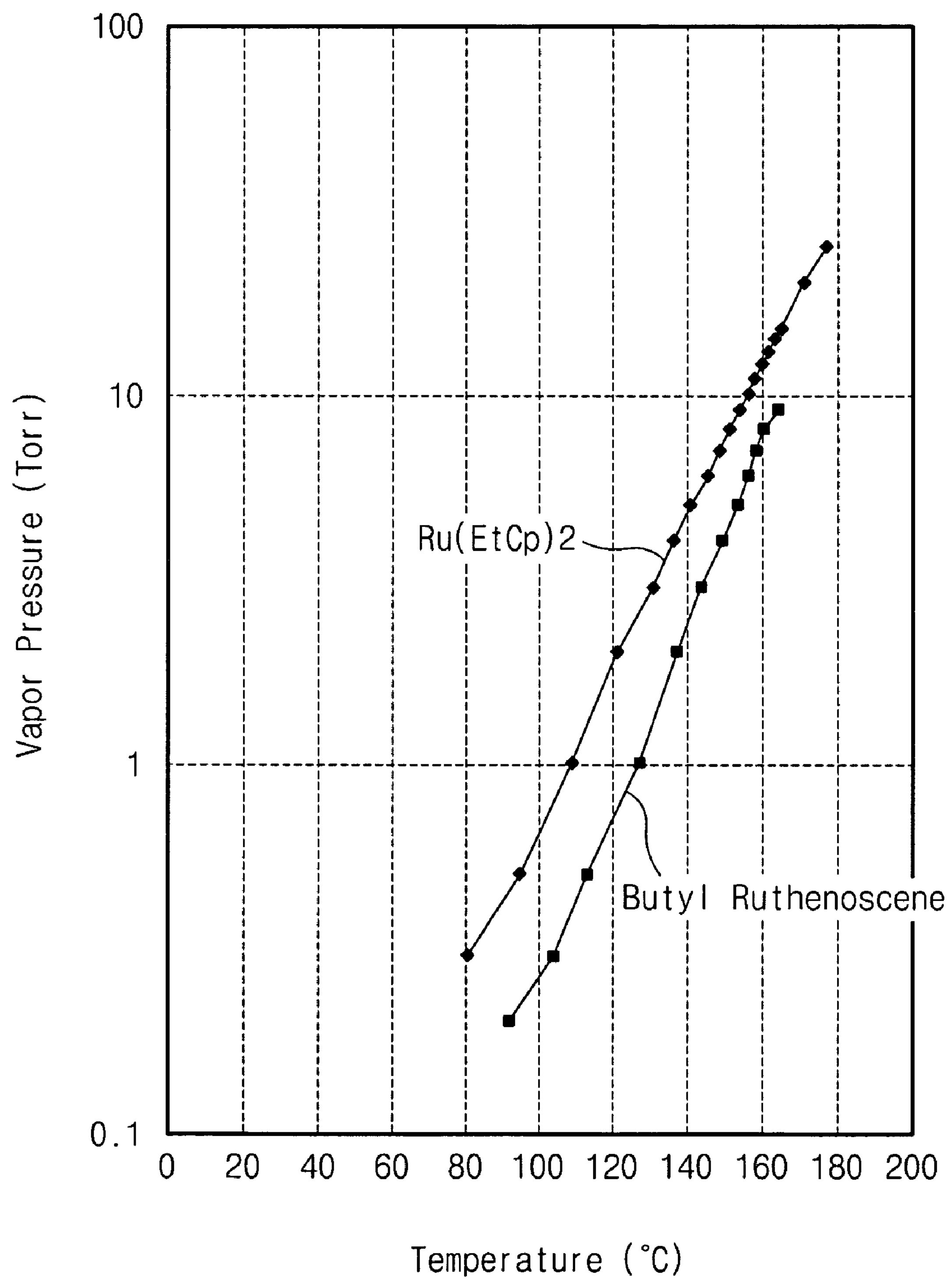
FIG. 3 is a graph showing vapor pressure as a function of temperature with respect to both butyl ruthenoscene [$C_5H_5Ru(C_5H_4CH_2CH_2CH_2CH_3)$] and a conventional bis(cyclopentadienyl)ruthenium [$Ru(EtCp)_2$].

FIG. 3 is a graph showing vapor pressure as a function of temperature with respect to both butyl ruthenoscene and a conventional $Ru(EtCp)_2$. As shown in FIG. 3, the vapor pressure of butyl ruthenoscene is lower than that of $Ru(EtCp)_2$ at a constant temperature.

In addition, the impurity contents hydrated or oxidized during the process may be analyzed with a chromatograph after forming the ruthenium layer using butyl ruthenoscene under typical conditions. In this case, the impurity contents are remarkably lower as compared with the process using $Ru(EtCp)_2$ under the same conditions.

In comparison with the conventional $Ru(EtCp)_2$ as mentioned above, butyl ruthenoscene according to the present invention is more stable as a source material. The stability of butyl ruthenoscene makes it possible to alleviate problems caused by chemical change in the ruthenium source under typical circumstances. Also, butyl ruthenoscene is more advantageous in both the fabrication and the recycling thereof.

Embodiment 1

In the following Examples 1-1 through 1-5, a two-step CVD process for forming a ruthenium layer will be described. The two-step CVD process includes forming a seed layer and forming a main layer using butyl ruthenoscene as the source material under different oxygen flow rates and different deposition pressures. In these method embodiments, the ruthenium layer may be typically stacked on a silicon oxide layer like other semiconductor devices. However, the ruthenium layer may be deposited on another ruthenium layer formed by sputtering. In addition, the ruthenium layer may be deposited on other material layers. According to the following examples, the ruthenium layer for an electrode may be formed using butyl ruthenoscene under the following conditions. The seed layer may be formed at a comparatively high oxygen flow rate, and the process pressure may be varied within a considerably wide limit, e.g., 0.5 to 5 Torr. While both surface morphology and step coverage characteristics may be more or less varied, the resulting ruthenium layer still may be used as an electrode.

It is not necessary that the main layer be formed at a higher pressure as compared with the seed layer. That is, the main layer may be formed under a constant pressure only by varying an oxygen flow rate in order to obtain an improved ruthenium layer. But, the process of using butyl ruthenoscene is more or less similar to the conventional process of using $Ru(EtCp)_2$ in respect of the oxygen flow rate, the process pressure, and a structure of the thin layer. Thus, the process pressure may be varied within a considerably wide limit, whereas oxygen needs to be supplied at a higher flow rate when forming the seed layer. For example, during the step of forming the seed layer at a low pressure of about 0.5 Torr, butyl ruthenoscene is supplied at a flow rate of 0.02 ccm, while oxygen is preferably supplied at a flow rate of about 500-2000 sccm. Meanwhile, the seed layer is preferably formed at a high process pressure. That is, the process pressure may be increased up to 30 Torr. On the other hand, during the step of forming the main layer, the pressure is preferably lowered to 0.5-10 Torr to avoid forming a columnar structure.

Butyl ruthenoscene and oxygen are preferably supplied at flow rates of about 0.02 ccm and about 40-1000 sccm, respectively.

The thickness of the ruthenium layer may vary according to process conditions like flow rate of the source gas, pressure, time, and temperature. Accordingly, characteristics like surface morphology and step coverage are preferably evaluated after forming the ruthenium layers with the same thickness and by considering correlations between the process conditions. Preferably, butyl ruthenoscene is supplied at a flow rate of 0.02 to 0.05 ccm and at a temperature of 250 to 400° C. for 1-3 minute(s) during the first and second steps. Under such process conditions, both the surface morphology and the step coverage are mostly independent of time and temperature, while the thickness is dependent on time and temperature.

EXAMPLE 1-1

Figure 4A:
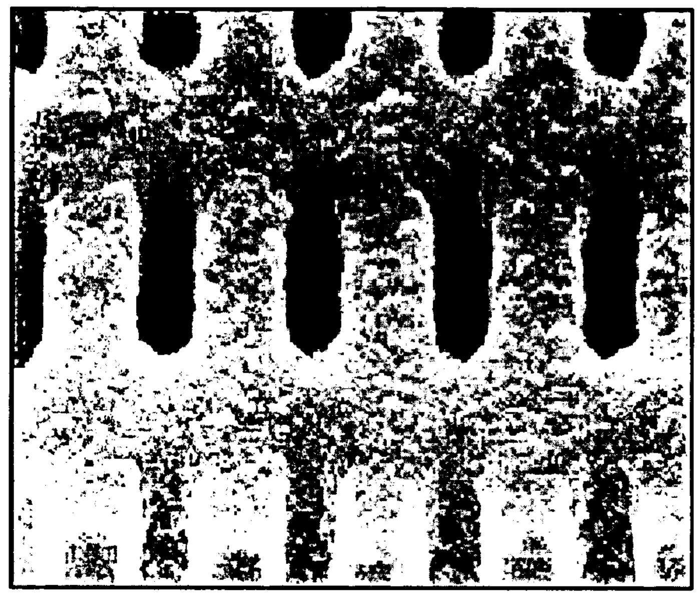
Figure 4B:
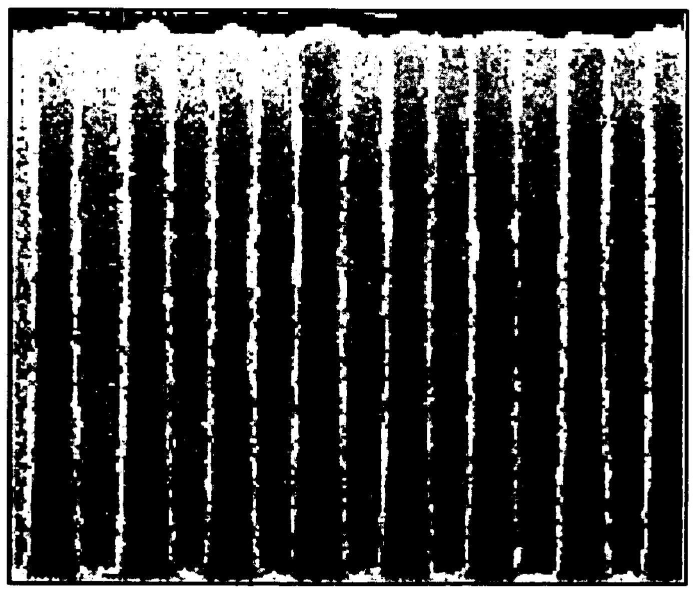

In a two-step CVD process using butyl ruthenoscene, a first step of depositing a seed layer was carried out under an oxygen flow rate of 1250 sccm and a deposition pressure of 1 Torr. A second step of depositing a main layer was carried out with an oxygen flow rate of 45 sccm and a deposition pressure of 0.5 Torr. FIGS. 4A and 4B show the resulting surface morphology and step coverage characteristics, respectively. In this case, the ruthenium layer was deposited on the silicon oxide layer at a temperature of 300° C. or higher and a flow rate of butyl ruthenoscene of 0.02 ccm or higher. As a result, the deposition rate and the step coverage of the ruthenium layer on a silicon oxide were 30 Å/min or higher and 80% or higher, respectively. Preferably, the step coverage is as high as possible.

EXAMPLE 1-2

Figure 5A:
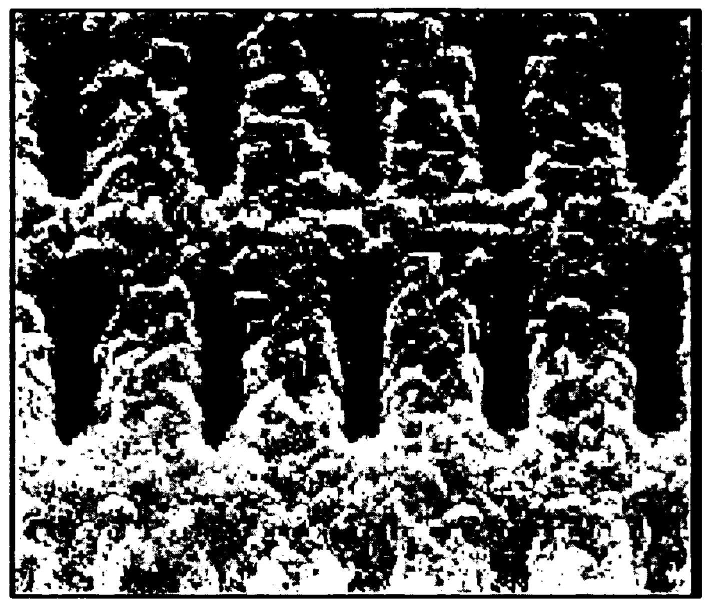
Figure 5B:
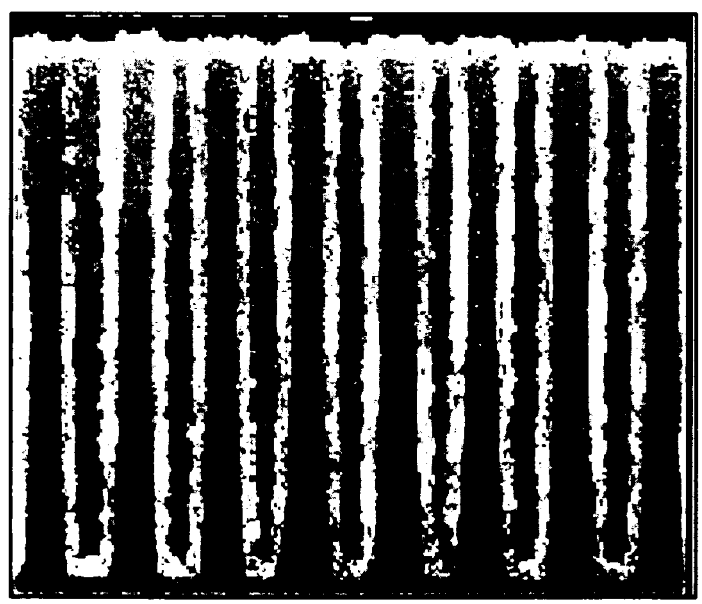

In a two-step CVD process using butyl ruthenoscene, a first step of depositing a seed layer was carried out with an oxygen flow rate of 1250 sccm and a deposition pressure of 0.5 Torr. A second step of depositing a main layer was carried out under an oxygen flow rate of 45 sccm and a deposition pressure of 5 Torr. That is, in the present embodiment, the seed layer was formed at a lower pressure as compared with the main layer. FIGS. 5A and 5B show the resulting surface morphology and step coverage characteristics, respectively. Both surface morphology and step coverage characteristics became worse as compared with the case of the Example 1-1. The ruthenium layer was deposited on the silicon oxide layer at a temperature of 300° C. or higher and a flow rate of butyl ruthenoscene of 0.02 ccm or higher. As a result, the deposition rate and the step coverage of the ruthenium layer on a silicon oxide were 60 Å/min or higher and 75% or higher, respectively.

EXAMPLE 1-3

Figure 6A:
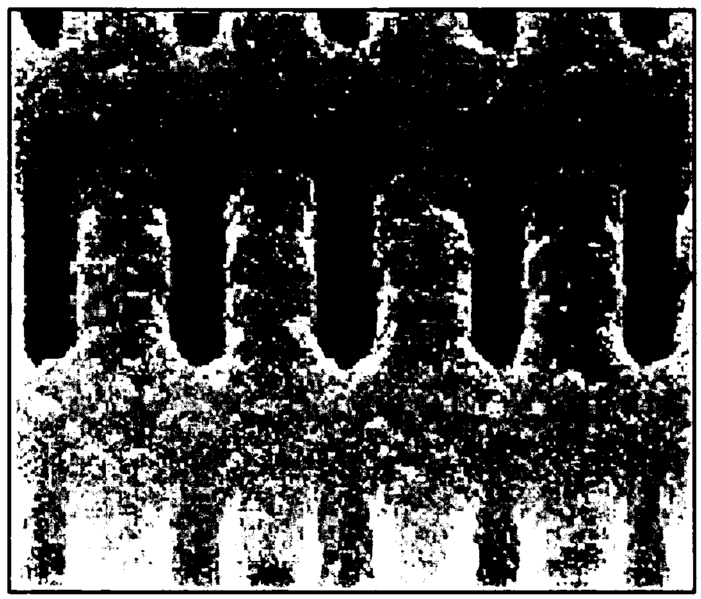
Figure 6B:
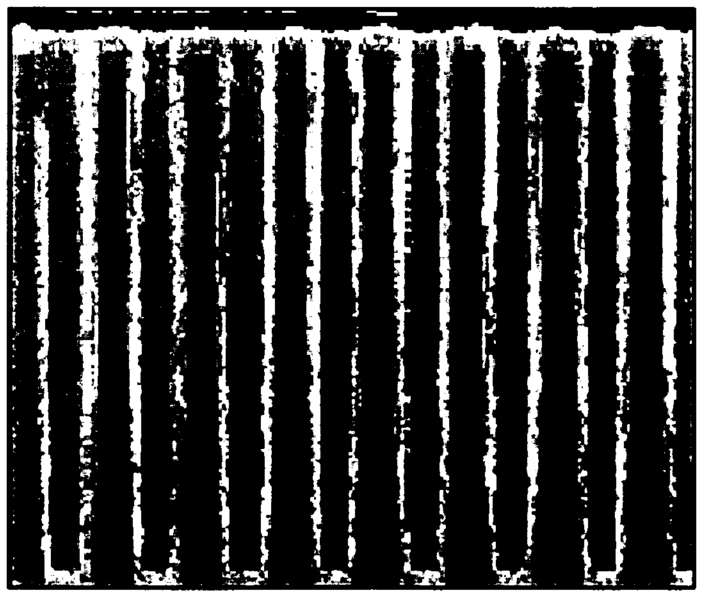

In a two-step CVD process using butyl ruthenoscene, a first step of depositing a seed layer was carried out with an oxygen flow rate of 1250 sccm and a deposition pressure of 0.5 Torr. A second step of depositing a main layer was carried out with an oxygen flow rate of 45 sccm and a deposition pressure of 0.5 Torr. That is, in this example, the deposition pressure remained unchanged during the first and second steps. As shown in FIGS. 6A and 6B, the surface morphology and the step coverage were similar to the results of the Example 1-1. The ruthenium layer was deposited on the silicon oxide layer at a temperature of 300° C. or higher and a flow rate of butyl ruthenoscene of 0.02 ccm or higher. As a result, the deposition rate and the step coverage of the ruthenium layer on a silicon oxide were 30 Å/min or higher and 85% or higher, respectively.

EXAMPLE 1-4

Figure 7A:
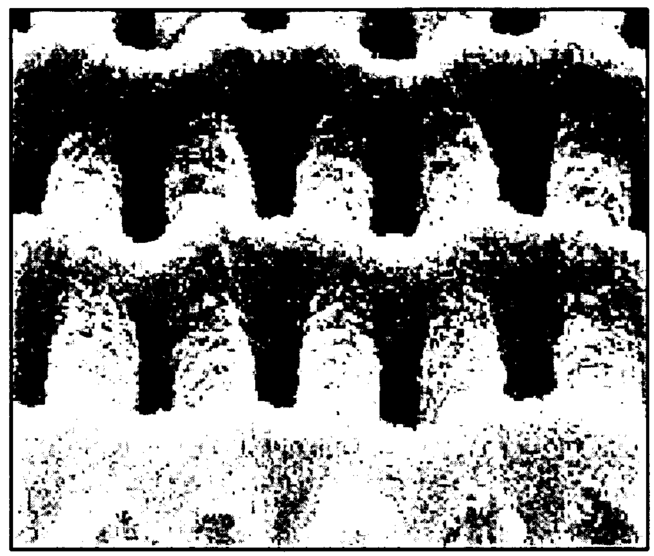
Figure 7B:
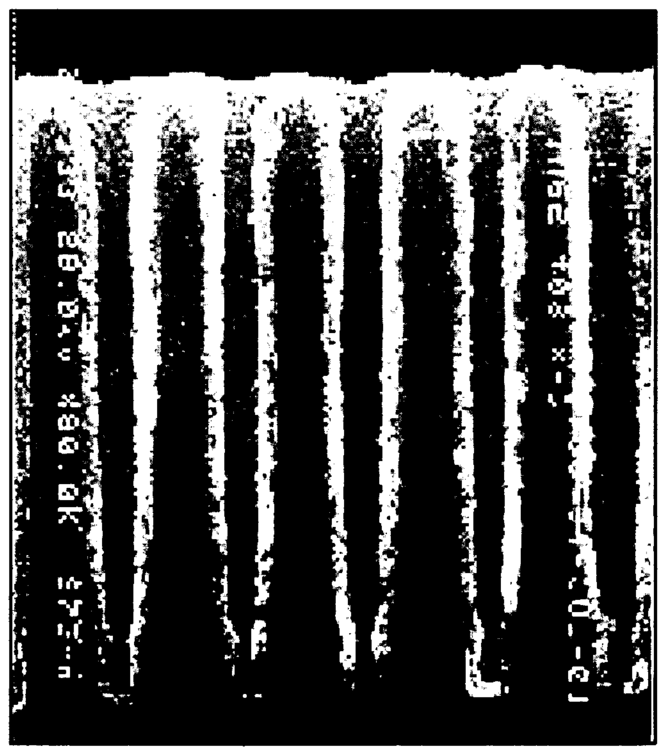

In a two-step CVD process using butyl ruthenoscene, a first step of depositing a seed layer was carried out with an oxygen flow rate of 1250 sccm and a deposition pressure of 5 Torr. A second step of depositing a main layer was carried out with an oxygen flow rate of 45 sccm and a deposition pressure of 0.5 Torr. FIGS. 7A and 7B show the resulting surface morphology and step coverage characteristics, respectively. The ruthenium layer was deposited on the silicon oxide layer at a low temperature of 250° C. and a flow rate of butyl ruthenoscene of 0.02 ccm or higher. As a result, as the temperature decreased, the deposition rate was reduced. The surface morphology characteristic was improved and the step coverage was 75% or higher.

EXAMPLE 1-5

Figures 8A, 8B:
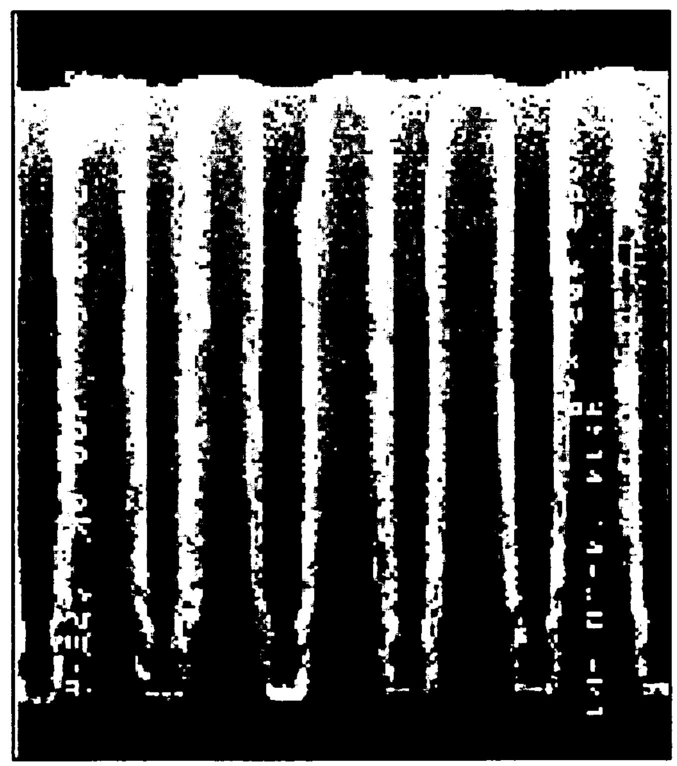

In a two-step CVD process using butyl ruthenoscene, with process conditions like those of the Example 1-4, a first step of depositing a seed layer was carried out with an oxygen flow rate of 1250 sccm and a deposition pressure of 5 Torr. A second step of depositing a main layer was carried out with an oxygen flow rate of 45 sccm and a deposition pressure of 0.5 Torr. But, the seed layer was deposited on another ruthenium layer formed by sputtering instead of a silicon oxide layer. As shown in FIGS. 8A and 8B, surface morphology and step coverage characteristics were improved as compared with the results of the Example 1-4. In this case, the two-step CVD process was performed at a temperature of 300° C. and a flow rate of butyl ruthenoscene of 0.02 ccm. As a result, the step coverage was 80% or higher.

Embodiment 2

According to further method embodiments of the present invention, a CVD process is performed using butyl ruthenoscene as a source material so that a ruthenium main layer is stacked on a ruthenium seed layer formed by sputtering. The oxygen flow rate and pressure conditions are the same as those described above for the step of forming the main layer of the Embodiment 1. For instance, a flow rate of oxygen and a deposition pressure may be about 45 sccm and about 0.5 Torr, respectively.

Embodiment 3

In the following Examples 3-1 through 3-4, a one-step CVD process using butyl ruthenoscene as a source material will be described. The one-step CVD process includes stacking a ruthenium layer without distinction between a seed layer and a main layer. Thus, in the one-step CVD process, a ruthenium layer is deposited under constant oxygen flow rate and deposition pressure conditions. The ruthenium layer is preferably deposited on a normal silicon oxide layer. However, the ruthenium layer may be deposited on other material layers. The thickness of the ruthenium layer may vary according to process conditions like source flow rate, pressure, time, and temperature. Accordingly, characteristics like surface morphology and step coverage are preferably evaluated after forming the ruthenium layers with the same thickness and by considering correlations between the process conditions. Preferably, the butyl ruthenoscene is supplied at a flow rate of 0.02 to 0.05 ccm and at a temperature of 250 to 400° C. for several minutes. Under such process conditions, both the surface morphology and the step coverage are mostly independent of time and temperature.

In the one-step CVD process, the ruthenium layer may be formed at a predetermined pressure while supplying oxygen at a sufficient flow rate. Thus, in these method embodiments, the oxygen flow rate was maintained within an intermediate or higher level, e.g., 300 to 2000 sccm, while the process pressure was varied within a range of 0.5 to 30 Torr.

When the oxygen flow rate was maintained within several hundred sccm, the surface morphology was improved at a rather high pressure. The oxygen flow rate was maintained at a high level, while the surface morphology remained good until the pressure was increased up to 5 Torr. However, as the pressure became 10 Torr or higher, the surface morphology deteriorated, although the deposition rate increased. As a result, the ruthenium layer formed a columnar structure. This was caused by an increase in the ratio of ruthenium oxide per unit area contained in the deposited layer.

Consequently, the ruthenium layer for an electrode may be formed under a flow rate of oxygen of over several hundred sccm and a pressure of over 0.5 Torr. Preferably, the process pressure is as high as possible. Meanwhile, when the flow rates of butyl ruthenoscene and oxygen were 0.02 ccm and about 1000 sccm, respectively, if the process pressure was 10 Torr or higher, the deposition rate of the ruthenium oxide became higher. At this time, the surface morphology of the ruthenium layer deteriorated. In particular, when the process pressure was 30 Torr or higher, it was difficult to obtain a stable layer for the electrode. Consequently, when oxygen was supplied at a flow rate of 1000 sccm or higher, the process pressure was preferably 10 Torr or less.

EXAMPLE 3-1

Figure 9:
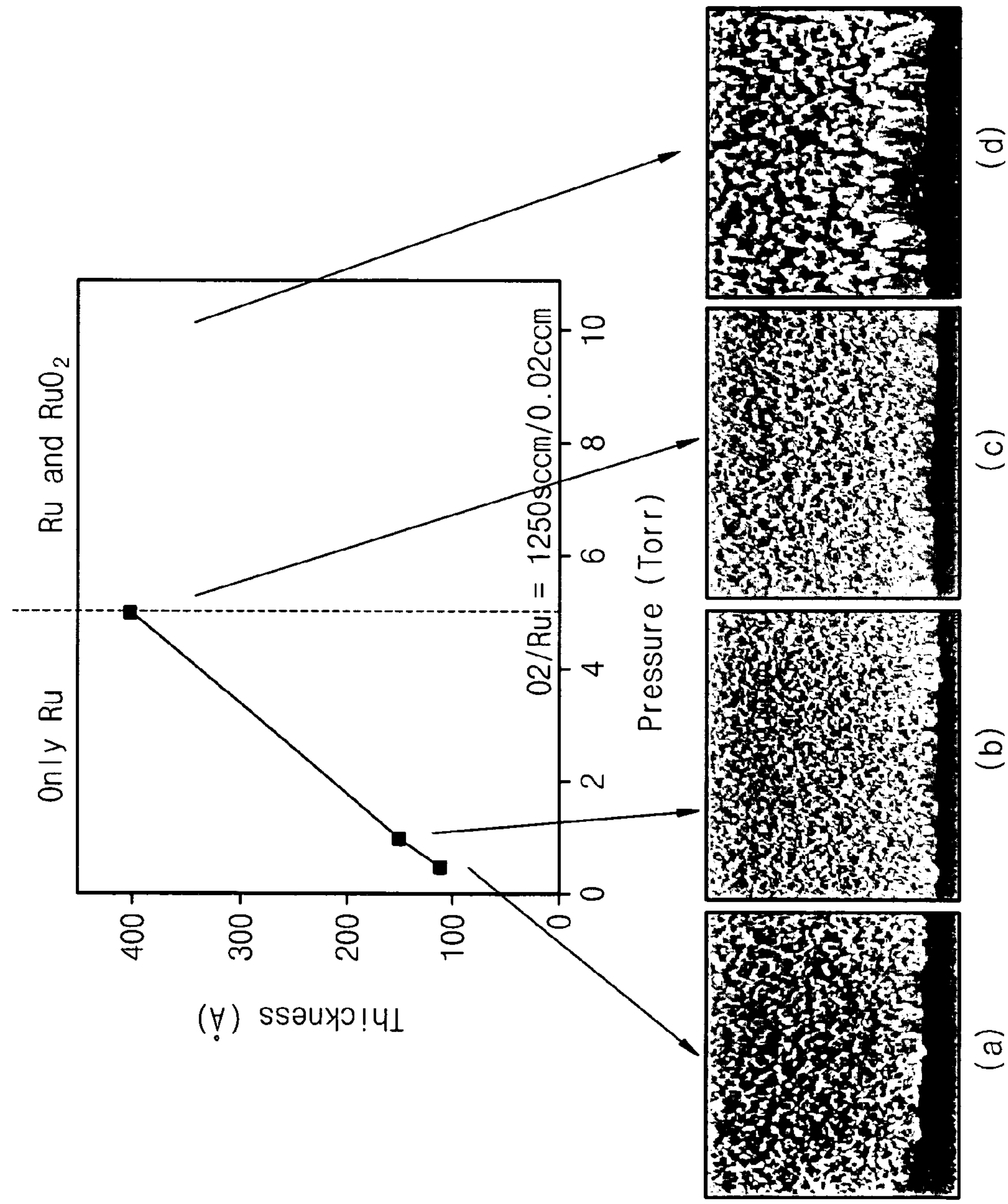
FIGS. 9 through 11 are graphs showing change in thickness with change in pressure as well as electron micrographs showing a surface morphology under each pressure for a ruthenium layer formed by a one-step CVD process using butyl ruthenoscene in accordance with embodiments of the present invention.

FIG. 9 shows the result obtained by performing a one-step CVD process using butyl ruthenoscene as a source material. The flow rates of oxygen and butyl ruthenoscene were 1250 sccm and 0.02 ccm, respectively. The deposition pressures were 0.5, 1, 5, and 10 Torr, respectively.

Until the deposition pressure was increased up to 5 Torr, the deposition rate of the ruthenium layer increased in proportion to the deposition pressure. That is, at the pressure of 0.5 Torr, the deposition rate was 30 Å/min; at the pressure of 5 Torr, the deposition rate was 100 Å/min. At this time, because the ruthenium oxide layer was hardly formed in the ruthenium layer, the surface morphology remained good. However, if the deposition pressure was 5 Torr or higher, the ratio of the ruthenium oxide layer to the ruthenium layer increased. Hence, the ruthenium layer exhibited a typical columnar structure.

Figure 14:
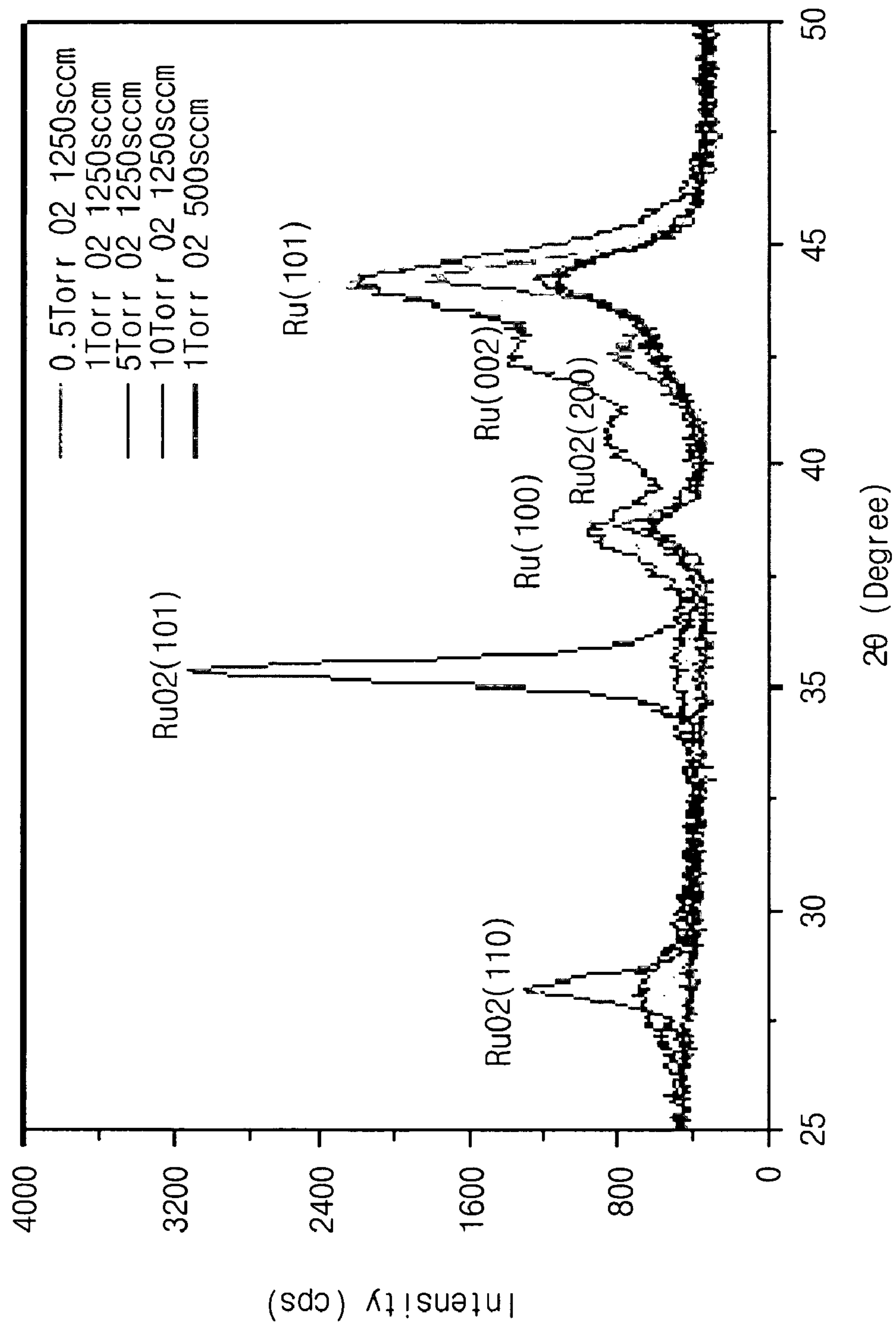
FIG. 14 is a graph showing an analysis of crystallinity of a ruthenium layer with change in deposition pressure in accordance with embodiments of the present invention.

A graph of a crystallinity analysis of FIG. 14 shows results of the present example as described above. In FIG. 14, when the deposition pressure was 10 Torr, a peak of an intensity was shown at a degree corresponding to the ruthenium oxide. However, even if the deposition pressure varied, peaks of the intensity were shown also at the degrees corresponding to the Miller index 100 and 101 of ruthenium in addition to the degree corresponding to the ruthenium oxide. In particular, when the deposition pressure was 5 Torr or less, a maximum peak of the intensity was shown only at the degree corresponding to a Miller index 101 of ruthenium. Accordingly, it may be appreciated that when supplying oxygen at a sufficient flow rate, a pure ruthenium layer was mainly formed under a deposition pressure of 5 Torr or less. That is, the deposition rate and the structure of the ruthenium layer were influenced by the ratio of the ruthenium oxide layer to the ruthenium layer.

EXAMPLE 3-2

Figure 10:
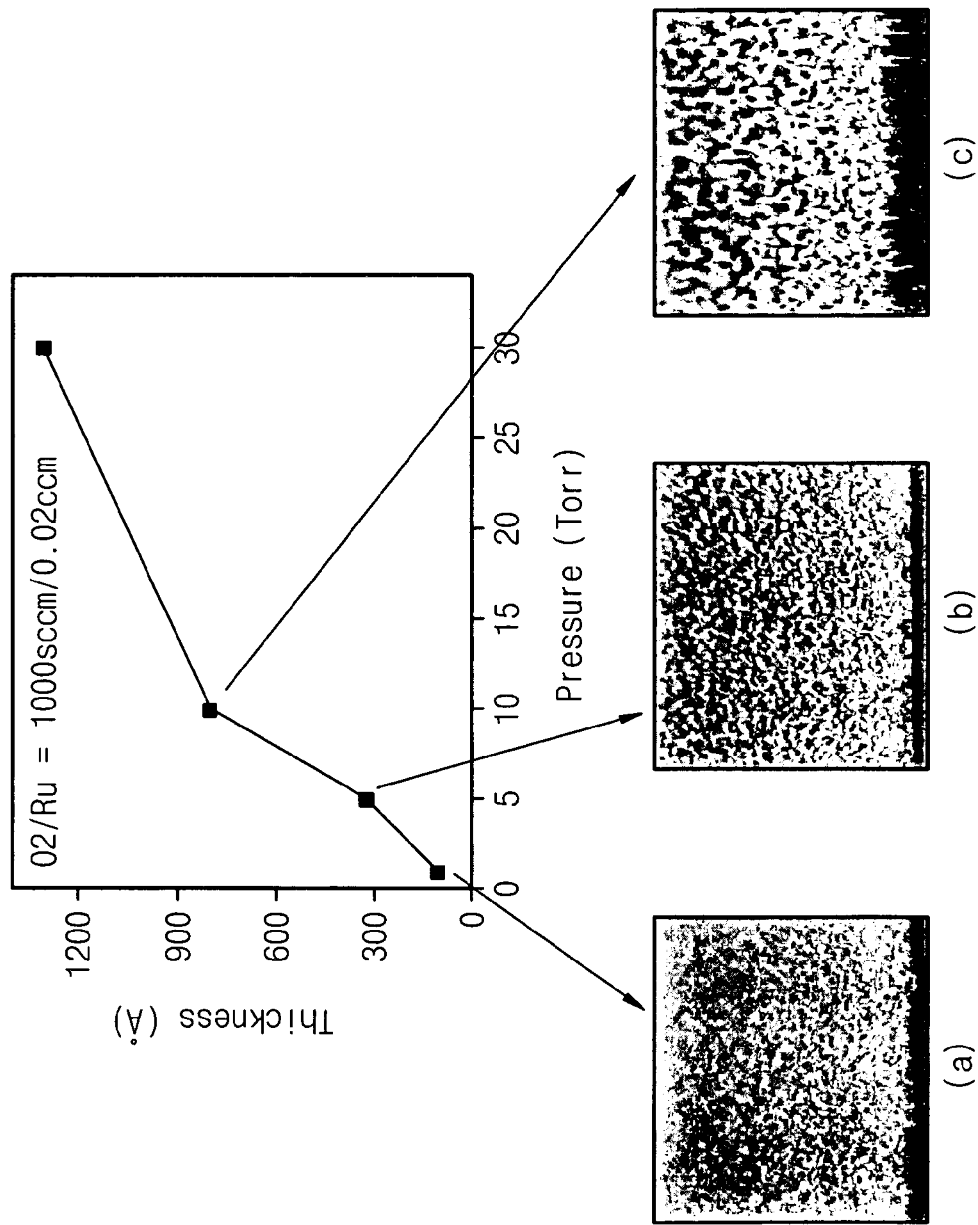

FIG. 10 shows the results obtained by performing a one-step CVD process using butyl ruthenoscene as a source material. The flow rates of oxygen and butyl ruthenoscene were 1000 sccm and 0.02 ccm, respectively. The deposition pressures were 1, 5, and 10 Torr, respectively.

As shown in FIG. 10, when the deposition pressure was increased from 5 to 10 Torr, the deposition rate increased remarkably, and the surface morphology deteriorated to form a columnar structure. As shown in an electron micrograph, the ruthenium layer formed at a pressure of 10 Torr exhibits a columnar structure. However, because the density and the granularity of columnar grains are high, and the ruthenium oxide layer existing in the ruthenium layer is also conductive, the ruthenium layer may be used as an electrode. But, the sheet resistance becomes higher as compared with the layers formed under a low pressure.

EXAMPLE 3-3

Figure 11:
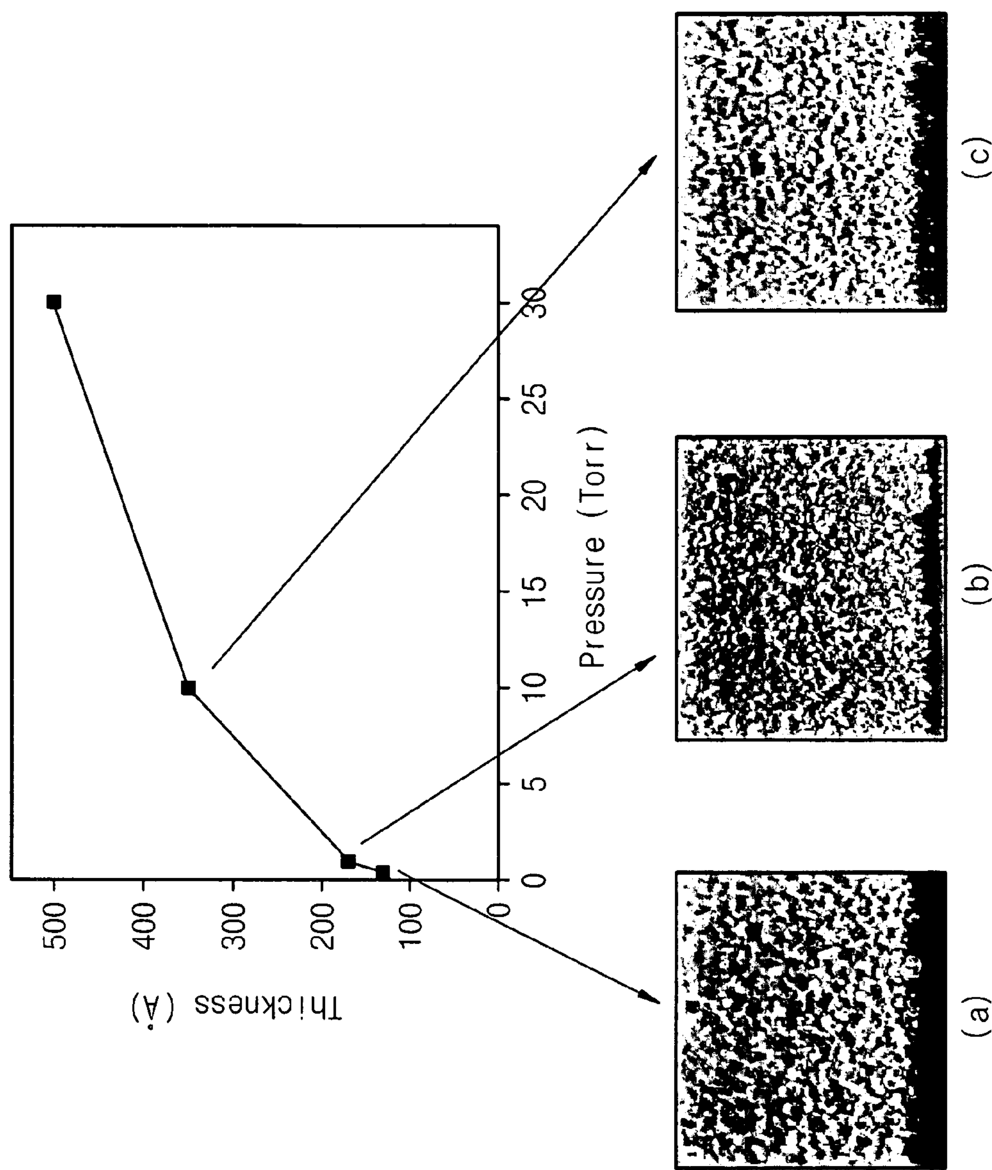

FIG. 11 shows the result obtained by performing a one-step CVD process using butyl ruthenoscene as a source material. The flow rates of oxygen and butyl ruthenoscene were 500 sccm and 0.03 ccm, respectively. The deposition pressures were 0.5, 1, 5, and 10 Torr, respectively.

Unlike the Examples 3-1 and 3-2, as the deposition pressure increased, the surface morphology improved. In this case, the formation of the ruthenium oxide layer made little difference. When the deposition pressure was increased from 0.5 to 1 Torr, the deposition thickness of the ruthenium layer was sharply increased. In general, however, the deposition thickness was gently increased in proportion to the pressure. That is, at the pressure of 0.5 Torr, the rate was 30 Å/min; at the pressure of 10 Torr, the rate was 100 Å/min. When the oxygen flow rate was decreased and the deposition pressure was low, the frequency of forming ruthenium nuclei was low. As a result, the ruthenium layer had a rough surface. However, as the deposition pressure became higher, the granularity of the deposition nuclei increased. Hence, the ruthenium layer exhibited a uniform surface.

EXAMPLE 3-4

Figure 12:
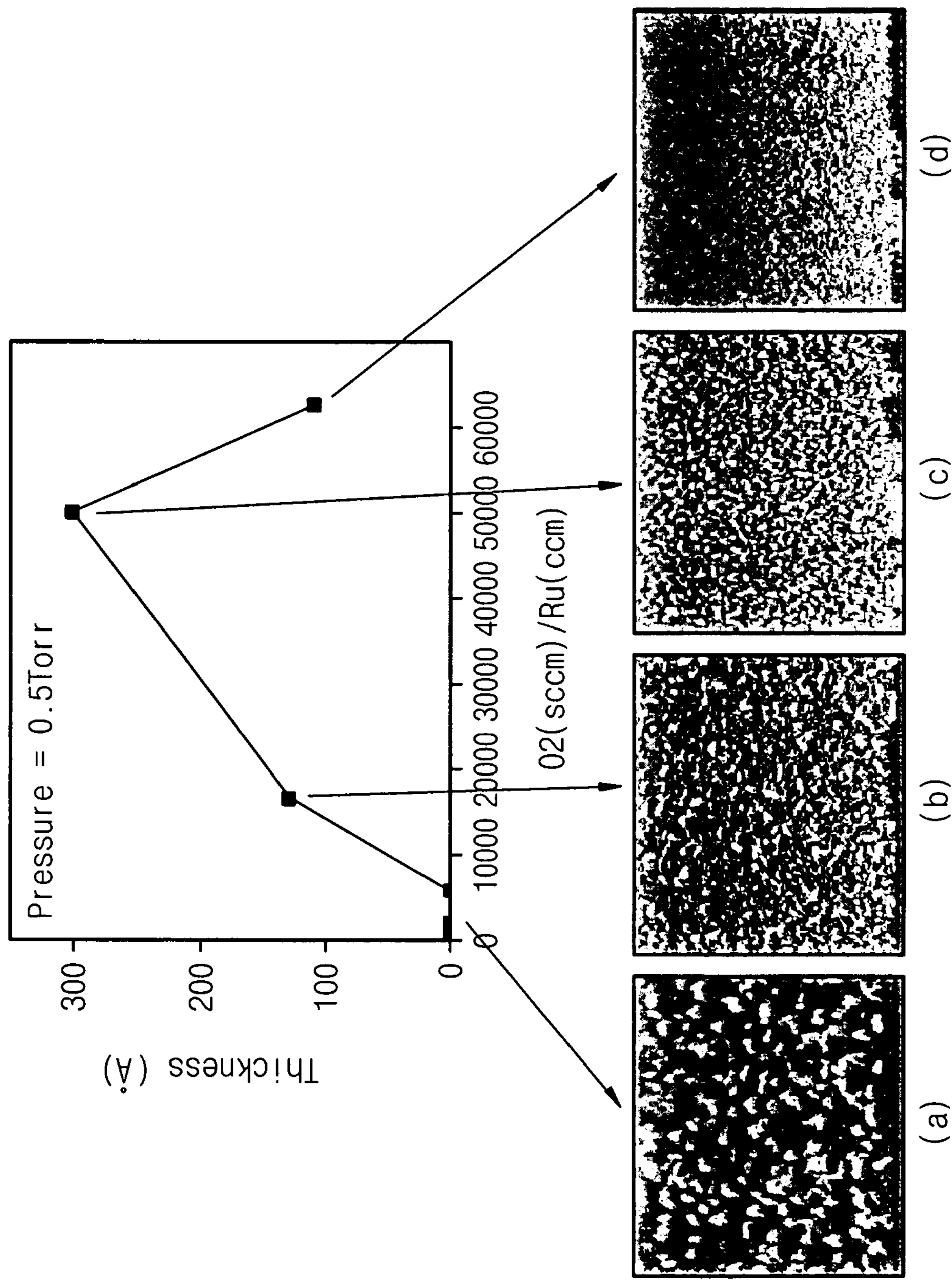
FIG. 12 is a graph showing change in thickness with change in ratio of oxygen to butyl ruthenoscene as well as electron micrographs showing a surface morphology under each ratio for a ruthenium layer formed by a one-step CVD process using butyl ruthenoscene in accordance with embodiments of the present invention.

FIG. 12 shows the result obtained by performing a one-step CVD process using butyl ruthenoscene as a source material. The deposition pressure was maintained at 0.5 Torr while varying the ratio of flow rate of butyl ruthenoscene to oxygen. At this time, while the flow rate of butyl ruthenoscene was maintained at 0.02 ccm, the flow rate of oxygen was gradually increased until the ratio of flow rate of oxygen to butyl ruthenoscene was 60000.

Under a low deposition pressure, the ruthenium layer was not deposited until the ratio of flow rate of oxygen to butyl ruthenoscene was about 5000 or higher. The deposition rate increased until the ratio of flow rates of oxygen to butyl ruthenoscene became 50000, and then decreased according to the present embodiment. However, the surface morphology of the ruthenium layer was improved according to an increase in the ratio of oxygen to butyl ruthenoscene.

EXAMPLE 3-5

Figure 13A:
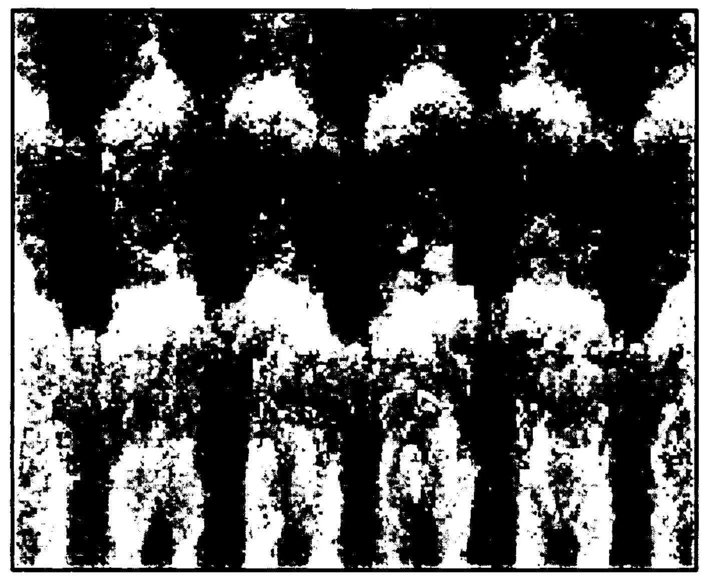
FIGS. 13A and 13B are electron micrographs showing both a surface morphology and a step coverage of a ruthenium layer formed by a one-step CVD process using butyl ruthenoscene in accordance with embodiments of the present invention.
Figure 13B:
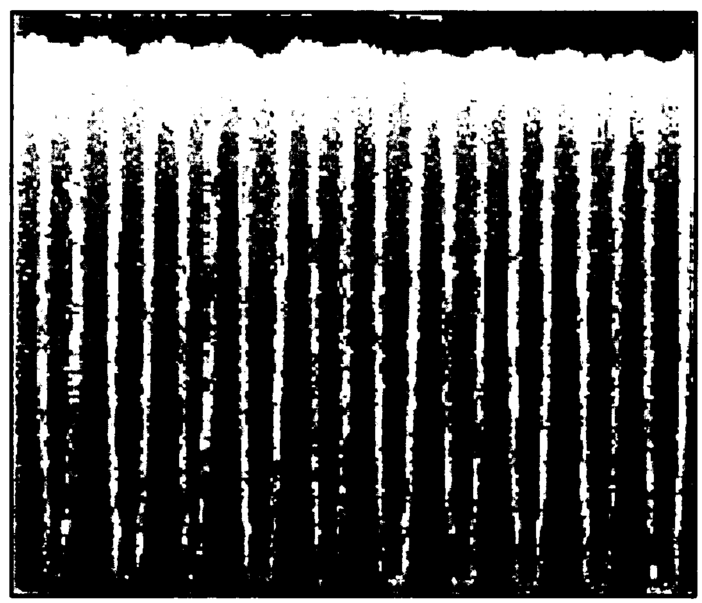

FIGS. 13A and 13B show the results obtained by performing a one-step CVD process using butyl ruthenoscene as a source material. Butyl ruthenoscene was supplied at a flow rate of 0.02 ccm. At this time, the oxygen flow rate was limited to about 500 sccm in order to remove an organic component from the butyl ruthenoscene. Also, an inert carrier material other than oxygen was used at a flow rate of 750 sccm. FIGS. 13A and 13B show the surface morphology and the step coverage of the deposited ruthenium layer, respectively. As a result, where other conditions remained the same, the surface morphology of the ruthenium layer became worse as compared with the case of using oxygen of 750 sccm instead of the inert carrier material. However, the surface morphology improved somewhat as compared with the case of not using the inert material but oxygen of 500 sccm. In addition, the step coverage was about 70%. When the inert carrier material was used, the step coverage characteristic was improved.

EXAMPLE 3-6

Figure 15:
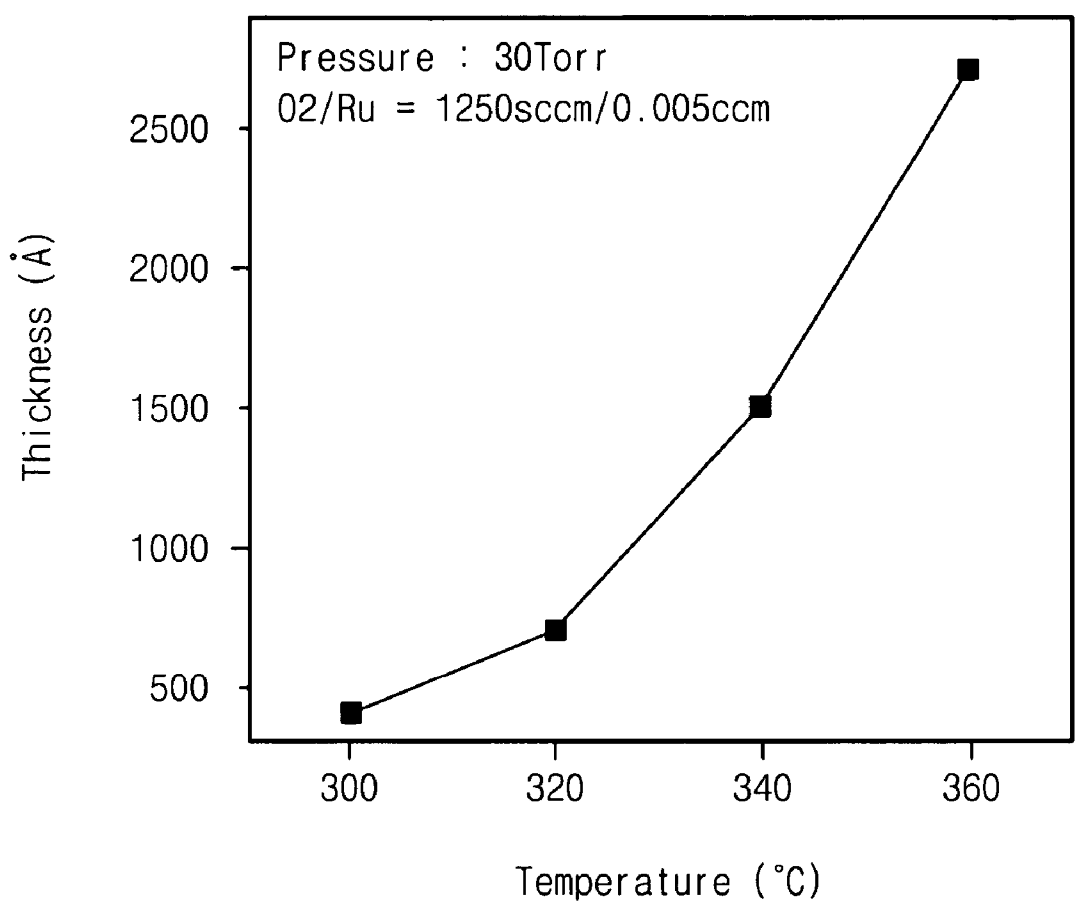
FIG. 15 is a graph showing a deposition rate of a ruthenium layer with change in temperature in accordance with embodiments of the present invention.

FIG. 15 shows the deposition rate of a ruthenium layer with change in temperature. The flow rates of butyl ruthenoscene and oxygen were 0.05 ccm and 1250 sccm, respectively. The deposition pressure was maintained at 30 Torr while varying the temperature from 300 to 360° C. The deposition rate of the ruthenium layer was increased with a decrease in temperature.

According to the present invention, a ruthenium layer with improved surface morphology and step coverage characteristics can be formed by a one-step or two-step CVD process. As a result, it is capable of economically forming a ruthenium layer that may be used as an electrode of an MIM-type capacitor, for example.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed is:

1. A method of forming a ruthenium film, comprising performing a chemical vapor deposition (CVD) process using butyl ruthenoscene [$C_5H_5Ru(C_5H_4CH_2CH_2CH_2CH_3)$] as a source gas and using an oxygen-containing gas as a reaction gas, wherein the performing the CVD process comprises forming a thin ruthenium seed layer and forming a thin ruthenium main layer, wherein forming the ruthenium seed layer and forming the ruthenium main layer are performed using different ratios of flow rate of oxygen-containing gas to butyl ruthenoscene under different deposition pressure conditions.

2. The method of claim 1, wherein the ruthenium seed layer is formed at a deposition pressure of 0.5 to 30 Torr.

3. The method of claim 1, wherein the ruthenium seed layer is formed at a flow rate of 500-2000 sccm for the oxygen-containing gas and at a flow rate of 0.02-0.05 ccm for the butyl ruthenoscene.

4. The method of claim 1, wherein the ruthenium main layer is formed at a deposition pressure of 0.5-10 Torr.

5. The method of claim 1, wherein the ruthenium main layer is formed at a flow rate of 40-1000 sccm for the oxygen-containing gas and at a flow rate of 0.02-0.05 for the butyl ruthenoscene.

6. The method of claim 1, wherein the ruthenium main layer is formed at a lower flow rate for the oxygen-containing gas than the ruthenium seed layer, and at a lower deposition pressure than the ruthenium seed layer.

7. The method of claim 1, wherein the CVD process is performed at a temperature of 250 to 400 degree Celsius.

8. The method of claim 1, wherein the ruthenium seed layer and the ruthenium main layer are formed at different temperature.

9. The method of claim 1, wherein the oxygen-containing gas is selected from a group consisting of oxygen, ozone and oxygen plasma.

10. The method of claim 1, further comprising a thin ruthenium layer by sputtering before forming the seed layer.

11. A method of forming a ruthenium film on a substrate, comprising:

providing a supply of butyl ruthenoscene [$C_5H_5Ru(C_5H_4CH_2CH_2CH_2CH_3)$];

providing a supply of an oxygen-containing gas selected from the group consisting of oxygen, ozone, and oxygen plasma;

depositing a ruthenium element from the butyl ruthenoscene onto the substrate using a chemical vapor deposition (CVD) process wherein the oxygen-containing gas reacts with the butyl ruthenoscene to separate the ruthenium element from the butyl ruthenoscene;

wherein the CVD process comprises forming a thin ruthenium seed layer and forming a thin ruthenium main layer; and wherein the ruthenium main layer is formed at a lower pressure and at a lower flow rate of an oxygen-containing gas than the ruthenium seed layer.

12. The method of claim 11, wherein the ruthenium seed layer is formed at a deposition pressure of 0.5 to 30 Torr.

13. The method of claim 11, wherein the ruthenium seed layer is formed at a flow rate of 500-2000 sccm for the oxygen-containing gas and at a flow rate of 0.02-0.05 ccm for the butyl ruthenoscene.

14. The method of claim 11, wherein the ruthenium main layer is formed at a deposition pressure of 0.5-10 Torr.

15. The method of claim 11, wherein the ruthenium main layer is formed at a flow rate of 40-1000 sccm for the oxygen-containing gas and at a flow rate of 0.02-0.05 for the butyl ruthenoscene.

16. The method of claim 11, wherein the ruthenium main layer is formed at a lower flow rate for the oxygen-containing gas than the ruthenium seed layer, and at a lower deposition pressure than the ruthenium seed layer.

17. The method of claim 11, wherein the CVD process is performed at a temperature of 250 to 400 degree Celsius.

18. The method of claim 11, further comprising a thin ruthenium layer by sputtering before forming the seed layer.

* * * * *